(12) United States Patent
Song et al.

(10) Patent No.: US 6,906,963 B2
(45) Date of Patent: Jun. 14, 2005

(54) SEMICONDUCTOR MEMORY DEVICE HAVING OUTPUT DRIVER FOR HIGH FREQUENCY OPERATION

(75) Inventors: Ho-sung Song, Seoul (KR); Ki-whan Song, Seoul (KR); Dong-su Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/607,634

(22) Filed: Jun. 27, 2003

(65) Prior Publication Data

US 2004/0004893 A1 Jan. 8, 2004

(30) Foreign Application Priority Data

Jul. 5, 2002 (KR) ................................ 10-2002-0038890

(51) Int. Cl.[7] ................................................ G11C 7/00
(52) U.S. Cl. ............................ 365/189.05; 365/189.09
(58) Field of Search ....................... 365/189.05, 189.09, 365/189.11, 203

(56) References Cited

U.S. PATENT DOCUMENTS

| 5,596,297 | A | * | 1/1997 | McClure et al. ............ 327/538 |
| 5,852,579 | A | * | 12/1998 | Arcoleo et al. ......... 365/189.05 |
| 6,429,686 | B1 | * | 8/2002 | Nguyen ....................... 326/86 |
| 6,714,050 | B2 | * | 3/2004 | McClintock et al. .......... 326/83 |

FOREIGN PATENT DOCUMENTS

| JP | 10-154391 | 6/1998 | ......... G11C/11/409 |
| KR | 00-3905 | 2/2000 | ............ G11C/7/00 |

* cited by examiner

*Primary Examiner*—Thong Le
(74) *Attorney, Agent, or Firm*—Mills & Onello LLP

(57) ABSTRACT

Provided is a semiconductor memory device having an output driver for high frequency operation. In the output driver of the semiconductor memory device, a first NMOS transistor and a second NMOS transistor are connected in series, the drain of the first NMOS transistor is connected to an output pad, and the source of the second NMOS transistor is connected to a ground voltage. In addition, a first internal voltage is applied to the gate of the first NMOS transistor, a second internal voltage is applied to a gate of the second NMOS transistor, and a voltage level of the second internal voltage is lower than the voltage level of an external supply voltage. The second internal voltage is generated directly from an internal voltage generating circuit of the semiconductor memory device or is externally applied. The voltage level of the second internal voltage is different from the level of an operating voltage of the semiconductor memory device.

9 Claims, 5 Drawing Sheets

US 6,906,963 B2

SEMICONDUCTOR MEMORY DEVICE HAVING OUTPUT DRIVER FOR HIGH FREQUENCY OPERATION

BACKGROUND OF THE INVENTION

This application claims the priority of Korean Patent Application No. 2002-38890, filed on 5 Jul. 2002, in the Korean Intellectual Property Office, the contents of which are incorporated herein in their entirety by reference.

1. Field of the Invention

The present invention relates to a semiconductor memory device, and more particularly, to a semiconductor device having an output driver capable of preventing distortion of output data when the semiconductor device performs a high frequency operation.

2. Description of the Related Art

Presently, semiconductor memory devices must be highly integrated and capable of performing operations quickly. In line with this, a newly developed memory that can transmit a considerable amount of data at a high speed while consuming low power is required. A double data rate dynamic random access memory (DDR DRAM) or a rambus DRAM having a higher operating speed than a synchronous DRAM (SDRAM) having a maximum operating speed of 100–200 MHz is expected to become popular.

FIG. 1 is a block diagram of a semiconductor memory device 100 having a conventional output driver, and FIG. 2 is a waveform diagram of an output wave of the output driver of FIG. 1.

Referring to FIG. 1, a semiconductor memory device 100 includes an output driver 110, a first driving circuit 120, and a second driving circuit 130. In the output driver 110, a first NMOS transistor N1 and a second NMOS transistor N2 are connected in series. A drain of the first NMOS transistor N1 is connected to an output pad DQ, and a source of the second NMOS transistor N2 is connected to a ground voltage VSS.

When data DATA is read, the first NMOS transistor N1 is turned on in response to a gate voltage VGATE. A gate Q of the second NMOS transistor N2 is turned on or off in response to a data voltage VEXT which is at the level of an external voltage EVCC.

The first driving circuit 120 receives a reference voltage REFV to generate the gate voltage VGATE. The second driving circuit 130 receives data DATA and the external voltage EVCC to generate the data voltage VEXT.

If data DATA is at a high level, the data voltage VEXT is generated at a high level, and thus the second NMOS transistor N2 is turned on. The output pad DQ outputs data DATA at a low level.

If data DATA is at a low level, the data voltage VEXT is generated at a low level, and thus the second NMOS transistor N2 is turned off. The output pad DQ outputs data DATA at a high level.

In general, the rambus DRAM has a high operating speed of 800 Mbps. However, when the rambus DRAM operates at a high speed over 800 Mbps, skew occurs in data DATA which is output to the output pad DQ.

A waveform of the gate voltage VEXT which is applied to the gate Q of the second NMOS transistor N2 is illustrated in FIG. 2(A).

Since the second NMOS transistor N2 is large in size, the load on the gate Q is great, and thus the data voltage VEXT is not capable of performing a full swing. In particular, the data voltage VEXT is not capable of performing the full swing more frequently when the data voltage VEXT changes between the low level and the high level than when the data voltage VEXT continues at the high level.

As shown in FIG. 2(A), the swing of the data voltage VEXT decreases by about 240 mV when the data voltage VEXT of the gate Q changes between the low level and the high level in comparison to the case in which the data voltage VEXT of the gate Q continues at the high level.

Due to the decrease in the swing as described above, a delay of about 57 ps for output of the output pad DQ occurs as shown in FIG. 2(B). As a result, margin of setup time or hold time based on an external clock signal decreases in the output of the rambus DRAM.

FIG. 3 is a timing diagram showing the relationship between a reference clock signal CTM of the rambus DRAM and data DATA. As a system operates at a high speed and a high operating frequency, a time specification of output data becomes tight. The data DATA sensed from a cell of the rambus DRAM is output such that its center is synchronized with a rising edge or a falling edge of the reference clock signal CTM.

The time from the rising edge or the falling edge of the reference clock signal CTM to the front of the data DATA is denoted as TQMAX, and the time from the rising edge or the falling edge of the reference clock signal CTM to the back of the data DATA is denoted as TQMIN. TQMAX and TQMIN are important specifications representing the output characteristics of the rambus DRAM.

FIG. 4 is a circuit diagram of an output driver circuit of the rambus DRAM. FIG. 5 is a waveform diagram illustrating a read operation of the output driver circuit of FIG. 4. FIG. 6 is a timing diagram showing a delay of data due to a rise in a voltage of a connection node of FIG. 4.

Referring FIG. 4, an output driver circuit 400 of the rambus DRAM includes a driver portion 410 having NMOS transistors N1 and N2, which are connected in series, an output pad DQ, and a precharge transistor 420.

In FIG. 4, a termination voltage VTERM and a termination resistor RTERM outside of a chip (not shown) where the output driver circuit 400 is mounted are shown.

Hereinafter, the operation of the output driver circuit 400 of the rambus DRAM will be described with reference to FIG. 4. When the data DATA is read, a first gate voltage VGATE is applied to the gate of the first NMOS transistor N1 of the driver portion 410 to turn on the first NMOS transistor N1. The first gate voltage VGATE is lower than the operating voltage of the device.

When the data DATA is not read, the first gate voltage VGATE is applied to the first NMOS transistor N1, and the first NMOS transistor N1 is turned on. Therefore, the capacitance of the driver portion 410 when the output pad DQ is viewed from outside increases, and thus a signal transmitted from another device may be distorted. Accordingly, the first gate voltage VGATE is required to be applied only when the data DATA is read.

The data DATA sensed from a DRAM core is applied to the gate Q of the second NMOS transistor N2. If the data DATA applied to the gate Q of the second NMOS transistor N2 is at a high level, the second NMOS transistor N2 is turned on and the data DATA at a low level is output through the output pad DQ.

The precharge transistor 420 precharges a connection node A of the first NMOS transistor N1 and the second NMOS transistor N2 to a level of a threshold voltage of the first gate voltage VGATE of the first NMOS transistor N1, so as to prevent the first NMOS transistor N1 from being turned on when the data DATA is not read.

Referring to FIG. 5, when the data DATA is read, the voltage level of the first gate voltage VGATE is raised from 0 V to the high level. The second gate voltage PVGATE, which is at a high level to precharge the connection node A, falls to a low level.

When the first gate voltage VGATE is raised from the low level to the high level, a charge coupling occurs in the connection node A due to the gate of the first NMOS transistor N1 to junction overlap. Therefore, the voltage level of the connection node A is raised by 100 mV, as shown in FIG. 5.

The rise in the voltage level of the connection node A decreases TQMAX by 13 ps when the data DATA is output to the output pad DQ at the high level.

If during a process the applied voltage, the temperature, or the like of the device is changed and thus the raised voltage of the connection node A increases, the delay in outputting first data at a high level through the output pad DQ will also increase.

SUMMARY OF THE INVENTION

The present invention provides a semiconductor memory device having an output driver which is capable of outputting data at a high frequency without distortion of data.

According to a first aspect of the present invention, there is provided a semiconductor memory device having an output driver in which a first NMOS transistor and a second NMOS transistor are connected in series, a drain of the first NMOS transistor is connected to an output pad, and the source of the second NMOS transistor is connected to a ground voltage. In the semiconductor memory device, a first internal voltage is applied to the gate of the first NMOS transistor and a second internal voltage is applied to the gate of the second NMOS transistor, and a voltage level of the second internal voltage is lower than the voltage level of an external supply voltage.

In one embodiment, the second internal voltage is generated directly from an internal voltage generating circuit of the semiconductor memory device or is externally applied from the outside. The voltage level of the second internal voltage can be different from the level of an operating voltage of the semiconductor memory device.

According to a second aspect of the present invention, there is provided a semiconductor memory device having an output driver in which a first NMOS transistor and a second NMOS transistor are connected in series, the drain of the first NMOS transistor is connected to an output pad, and the source of the second NMOS transistor is connected to a ground voltage. The device includes a driving circuit which applies a driving voltage to the gate of the second NMOS transistor in response to data and an internal supply voltage. In the semiconductor memory device, a ground voltage level of the driving circuit is higher than the voltage level of the ground voltage to which the source of the second NMOS transistor is connected.

The voltage level of the driving voltage can be different from the level of an operating voltage of the semiconductor memory device. The voltage level of the driving voltage can be lower than the voltage level of an external supply voltage.

According to a third aspect of the present invention, there is provided a semiconductor memory device having an output driver in which a first NMOS transistor and a second NMOS transistor are connected in series, the drain of the first NMOS transistor is connected to an output pad, and the source of the second NMOS transistor is connected to a ground voltage. The device includes a precharge transistor the source of which is connected to a connection node of the first NMOS transistor and the second NMOS transistor and the drain of which is connected to a supply voltage. In the semiconductor memory device, the precharge transistor includes a voltage compensating circuit for lowering the rise in the voltage level of the connection node due to the rise in the voltage level of the gate of the first NMOS transistor.

The voltage compensating circuit can include a capacitor which is connected between the gate and the source of the precharge transistor. The capacitor can have the same capacitance as a coupling capacitor between the gate and the source of the first NMOS transistor. The precharge transistor can be an NMOS transistor.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
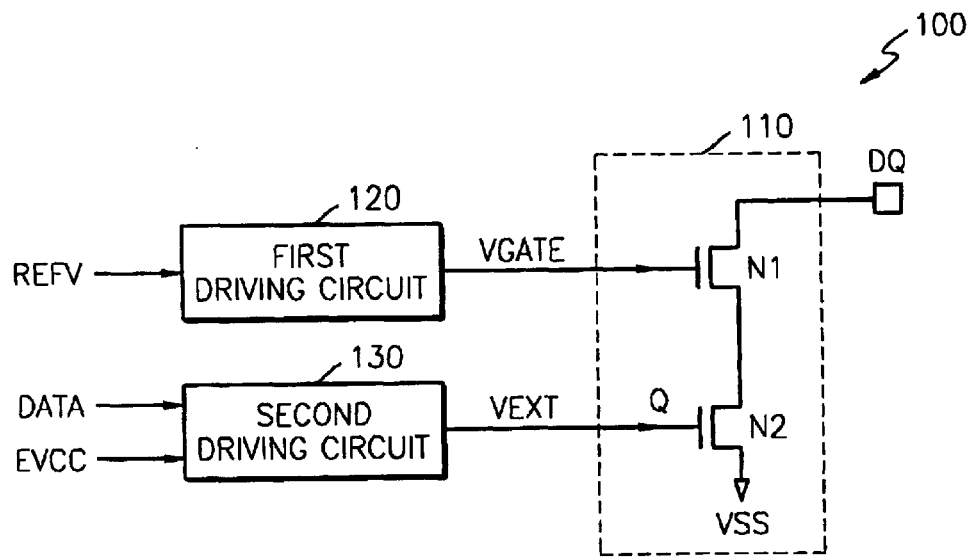
FIG. 1 is a block diagram of a semiconductor memory device having a conventional output driver.

The present invention now will be described more fully with reference to the accompanying drawings, in which preferred embodiments of the invention are shown. In the drawings, the shapes of elements are exaggerated for clarity.

Figure 7:
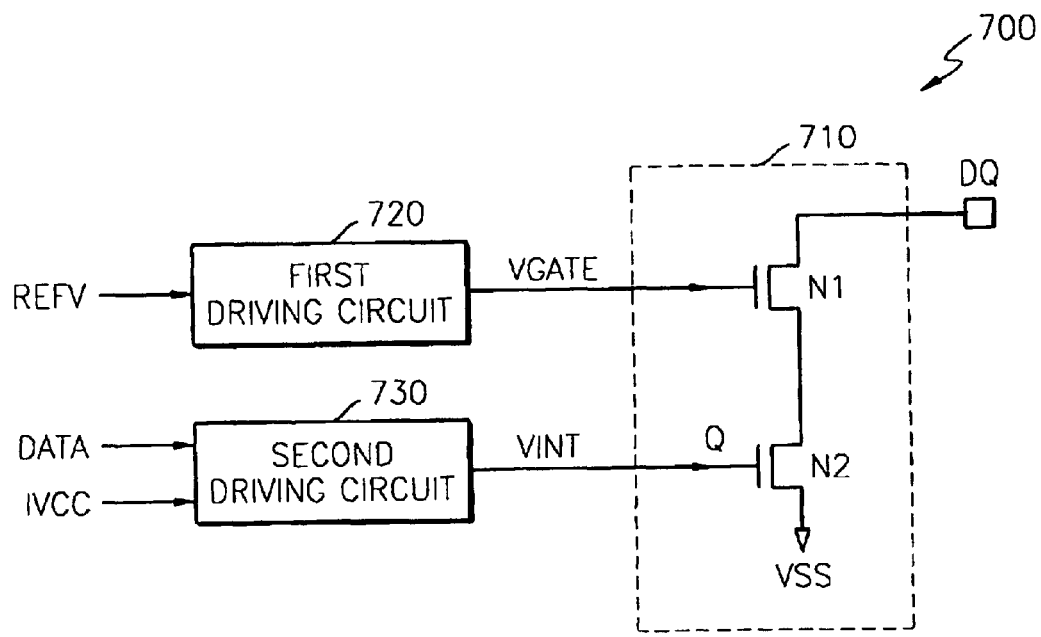
FIG. 7 is a block diagram of a semiconductor memory device having an output driver according to a first embodiment of the present invention.

FIG. 7 is a block diagram of a semiconductor memory device having an output driver according to a first embodiment of the present invention. Referring to FIG. 7, a semiconductor memory device 700 according to a first embodiment of the present invention includes an output driver 710 in which a first NMOS transistor N1 and a second NMOS transistor N2 are connected in series, the drain of the first NMOS transistor N1 is connected to an output pad DQ, and the source of the second NMOS transistor N2 is connected to a ground voltage VSS. A first internal voltage VGATE is applied to the gate of the first NMOS transistor N1, and a second internal voltage VINT is applied to the gate of the second NMOS transistor N2. The second internal voltage VINT is lower than an external supply voltage.

The second internal voltage VINT is generated from an internal voltage generating circuit of the semiconductor memory device 700 or is externally applied directly from outside the semiconductor memory device 700. The voltage level of the second internal voltage VINT may be different from the level of an operating voltage of the semiconductor memory device 700.

Hereinafter, operation of the semiconductor memory device according to the first embodiment of the present invention will be described with reference to FIG. 7.

In the semiconductor memory device 700 of FIG. 7, a first driving circuit 720 which generates a first internal voltage VGATE and a second driving circuit 730 which generates a second internal voltage VINT are shown beside the output driver 710.

When data DATA is read, the first driving circuit 720 generates the first internal voltage VGATE for driving the first NMOS transistor N1 of the output driver 710. The second driving circuit 730 receives an internal supply voltage IVCC and data DATA sensed and outputted from a DRAM cell (not shown) and generates the second internal voltage VINT having the same logic level as the logic level of the data DATA.

If the data DATA has a high frequency, such as data in a rambus DRAM, the second internal voltage VINT output from the second driving circuit 730 is not capable of performing a full swing between the high level and the low level. This is particularly the case when the logic level of the outputted data DATA changes between the high level and the low level because the time necessary for the rise of the data DATA is long in comparison to the high frequency of the data DATA.

Accordingly, in the device of the invention, the second internal voltage VINT is generated at a lower level than the conventional level of the external supply voltage. Then, the time necessary for swinging the second internal voltage VINT from the low level to the high level is reduced in proportion to the fallen voltage level, and thus a full swing can be performed.

Figure 2:
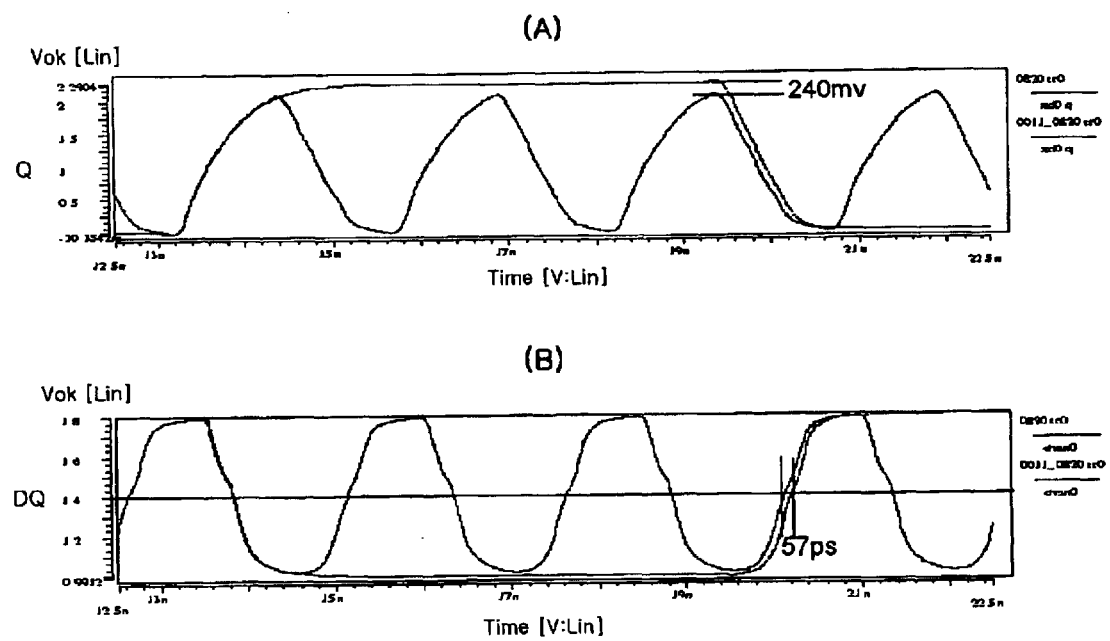
FIG. 2 is a waveform diagram of an output signal of the output driver of FIG. 1.
Figure 3:
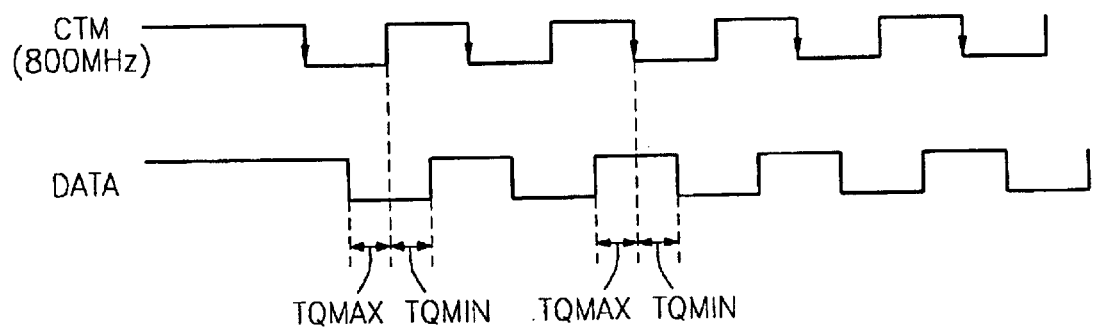
FIG. 3 is a timing diagram showing the relationship between a reference clock signal of the rambus DRAM and data.
Figure 4:
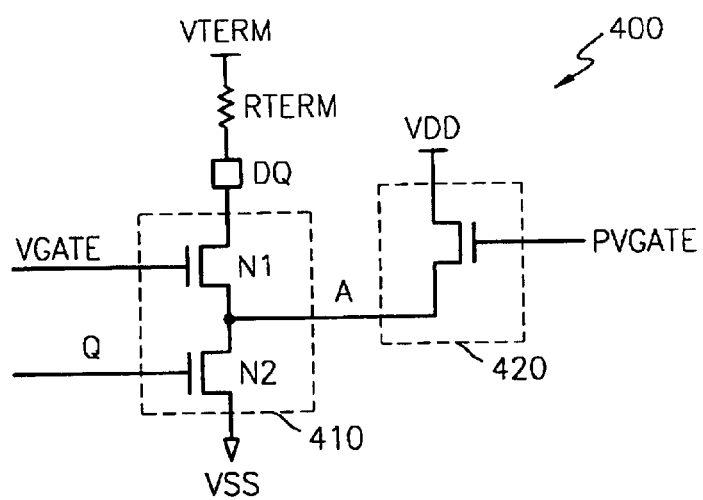
FIG. 4 is a circuit diagram of an output driver circuit of the rambus DRAM.
Figure 5:
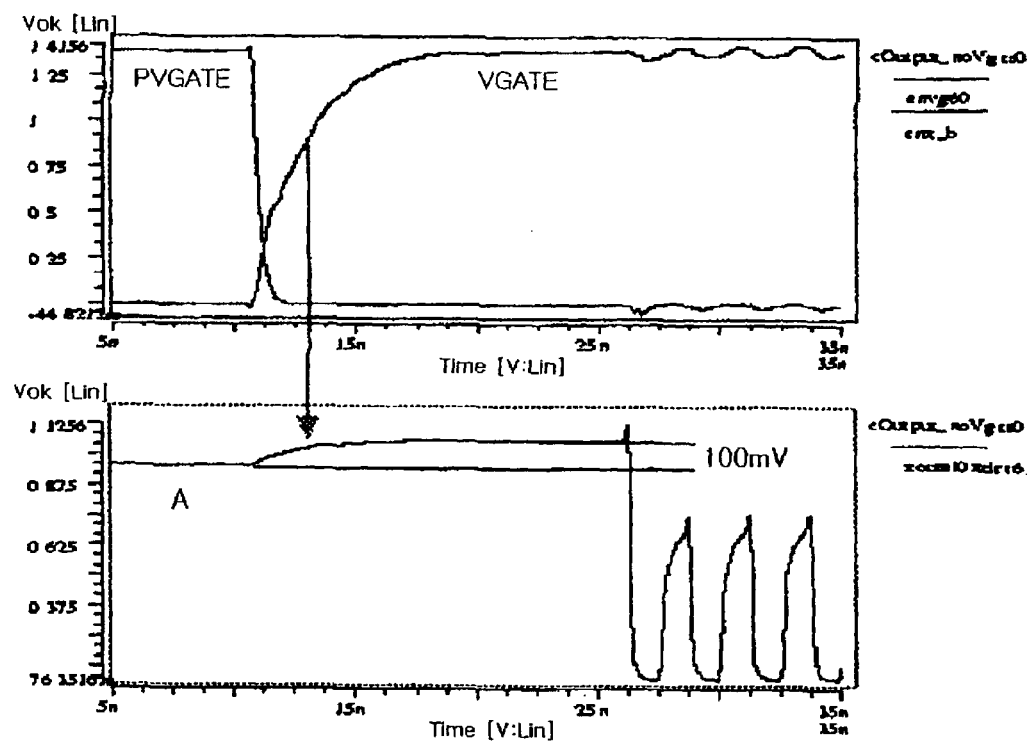
FIG. 5 is a waveform diagram for illustrating a read operation of the output driver circuit of FIG. 4.
Figure 6:
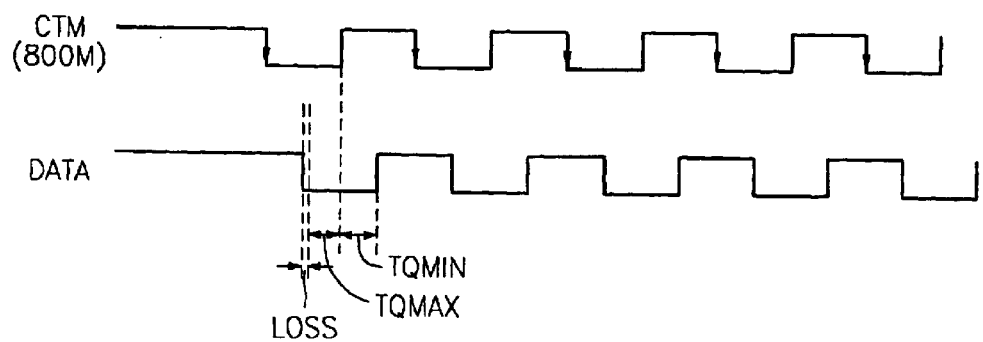
FIG. 6 is a timing diagram showing a delay for data due to a rise in a voltage of a connection node of FIG. 4.

If the voltage level of the second internal voltage VINT is lowered, the waveform of the gate Q of the second NMOS transistor N2 has a spherical shape as shown in FIG. 2A. Then, the waveform output from the output pad DQ may be delayed.

The voltage level of the second internal voltage VINT may be generated from the internal voltage generating circuit, such as the second driving circuit 730 shown in FIG. 7, or may be applied directly from outside the chip.

In addition, the voltage level of the second internal voltage VINT may be different from the level of the operating voltage level which operates other circuits of the semiconductor memory device 700.

Figure 8:
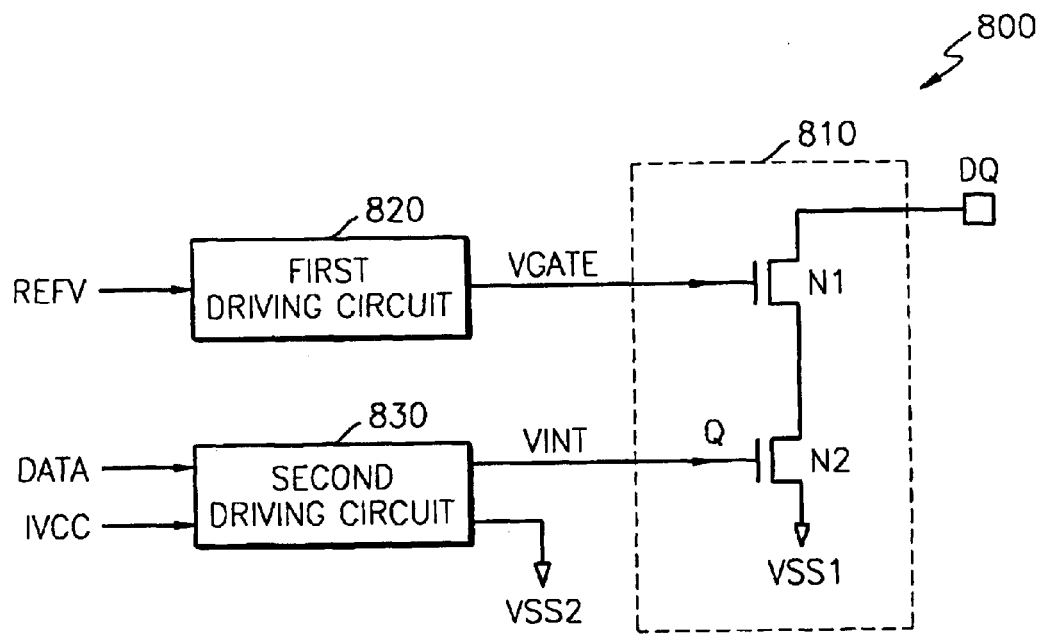
FIG. 8 is a block diagram of a semiconductor memory device having an output driver according to a second embodiment of the present invention.

FIG. 8 is a block diagram of a semiconductor memory device having an output driver according to a second embodiment of the present invention. Referring to FIG. 8, a semiconductor memory device 800 according to the second embodiment of the present invention includes an output driver 810 in which a first NMOS transistor N1 and a second NMOS transistor N2 are connected in series, the drain of the first NMOS transistor N1 is connected to an output pad DQ, and the source of the second NMOS transistor N2 is connected to a ground voltage VSS1. The semiconductor memory device 800 also includes a first driving circuit 820 and a second driving circuit 830 which applies a driving voltage VINT to the gate of the second NMOS transistor N2 in response to an internal supply voltage IVCC. A ground voltage level VSS2 of the second driving circuit 830 is higher than the ground voltage level VSS1 to which the source of the second NMOS transistor N2 is connected.

The voltage level of the driving voltage VINT may be different from the level of the operating voltage of the semiconductor memory device 800. The voltage level of the driving voltage VINT may be lower than that of the external supply voltage.

Hereinafter, the operation of the semiconductor memory device according to the second embodiment will be described with reference to FIG. 8. When the data DATA is read, the first NMOS transistor N1 is turned on. When a high level of the driving voltage VINT is applied to the gate Q of the second NMOS transistor N2, the second NMOS transistor N2 is turned on, and thus the output signal is outputted at a low level.

The second driving circuit 830 applies the driving voltage VINT to the gate Q of the second NMOS transistor N2 in response to the data DATA and the internal supply voltage IVCC. The function of the second driving circuit 830 is the same as that of the second driving circuit 730 of FIG. 7, and therefore detailed descriptions thereof will not be repeated here.

The first driving circuit 820 generates a gate voltage VGATE from a reference voltage REFV, for driving the first NMOS transistor N1 of the output driver 810. The functions of the first driving circuit 820 are the same as those of the first driving circuit 720 of FIG. 7, and thus detailed descriptions thereof will not be repeated here.

In the first embodiment of FIG. 7, the voltage level of the high level of the second internal voltage VINT, which is applied to the gate Q of the second NMOS transistor N2 of the output driver 710, is lowered so as to perform a full swing from the low level to the high level.

In the second embodiment illustrated in FIG. 8, the voltage level of the low level of the driving voltage VINT, which is applied to the gate Q of the second NMOS transistor N2 of the output driver 810, is enhanced. Here, the voltage level of the ground voltage VSS2 of the second driving circuit 830 is enhanced to be higher than the voltage level of the ground voltage VSS1 of the output driver 810, and thus the voltage level of the low level of the driving level VINT is enhanced accordingly. The time necessary for the driving voltage VINT to perform a swing from the low level to the high level is decreased by the enhanced voltage, and thus a full swing may be performed.

The voltage level of the driving level VINT may be different from that of the operating voltage level which operates other circuits of the semiconductor memory device 800. In addition, the voltage level of the driving voltage VINT may be lower than the external supply voltage and achieves results similar to those shown in the first embodiment of FIG. 7.

Figure 9:
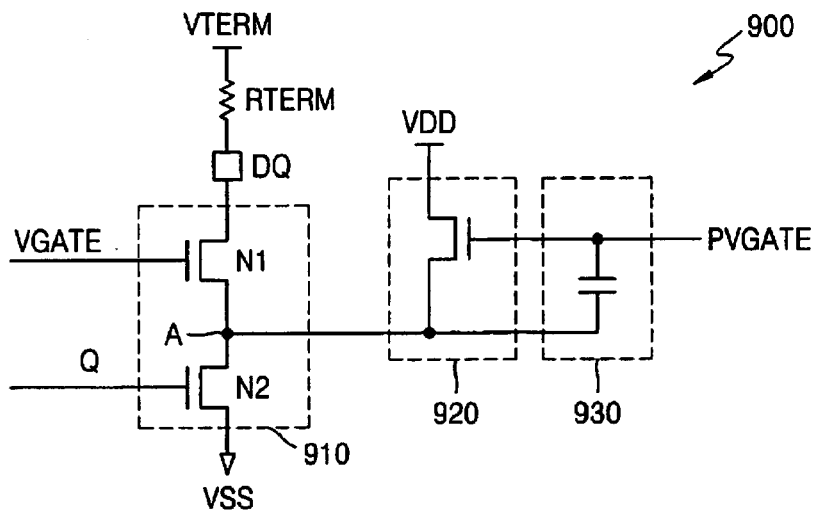
FIG. 9 is a circuit diagram of a semiconductor memory device according to a third embodiment of the present invention.
Figure 10:
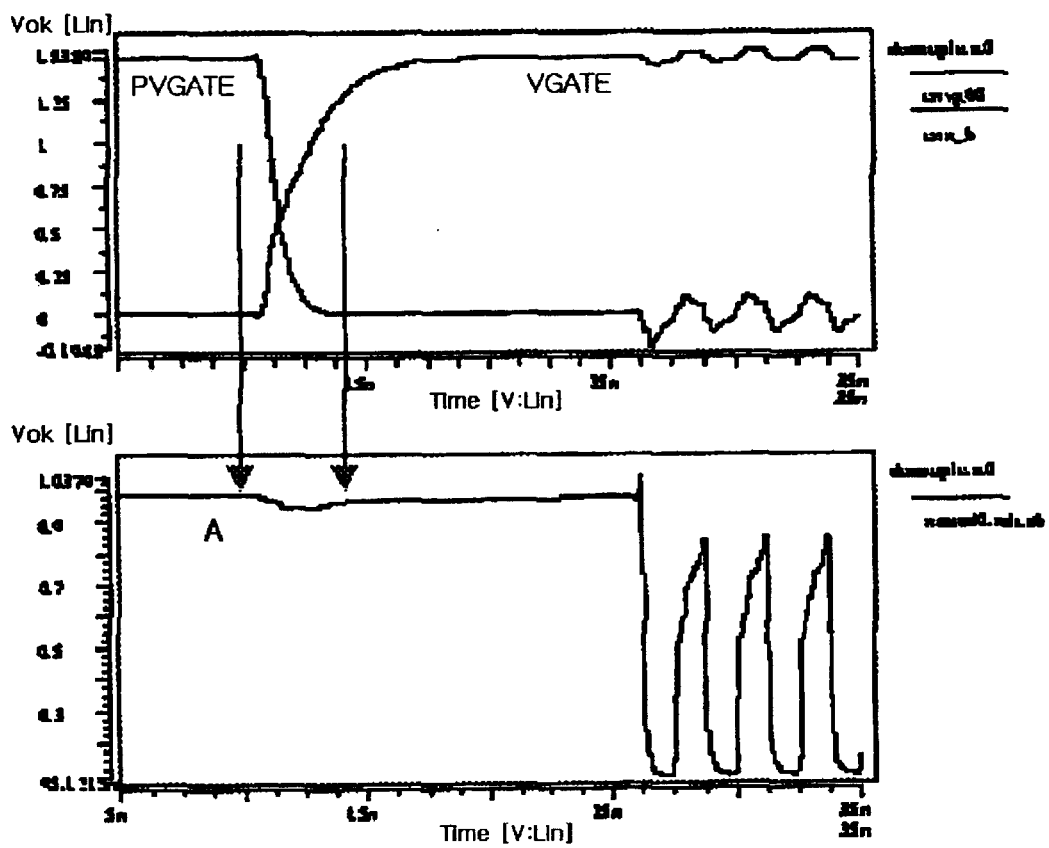
FIG. 10 is a waveform diagram for explaining a read operation of the output driver of FIG. 9.

FIG. 9 is a circuit diagram of a semiconductor memory device according to a third embodiment of the present invention. FIG. 10 is a waveform diagram for illustrating a read operation of the output driver of FIG. 9.

Referring to FIG. 9, a semiconductor memory device 900 according to the third embodiment of the present invention includes an output driver 910 in which a first NMOS transistor N1 and a second NMOS transistor N2 are connected in series, the drain of the first NMOS transistor N1 is connected to an output pad DQ, and the source of the second NMOS transistor N2 is connected to a ground voltage VSS. The semiconductor device 900 also includes a precharge transistor 920, in which the source is connected to a connection node A of the first NMOS transistor N1 and the second NMOS transistor N2 and the drain is connected to a supply voltage VDD. A voltage compensating circuit 930 between the connection node A of the output driver 910 and the gate of the precharge transistor 920 lowers the rise in the voltage level of the connection node A due to the rise in the voltage level of the gate of the first NMOS transistor N1.

The voltage compensating circuit 930 may be a capacitor which is connected between the gate and the source of the precharge transistor 920. The capacitor has the same capacitance as a coupling capacitor between the gate and the source of the first NMOS transistor N1. The precharge transistor 920 may be an NMOS transistor.

Hereinafter, the operation of the semiconductor memory device according to the third embodiment of the present invention will be described with reference to FIG. 9. When the data is read, the voltage level of the second gate voltage PVGATE is lowered from the high level to the low level, contrary to the first gate voltage VGATE which is applied to the first NMOS transistor N1.

The voltage compensating circuit 930 lowers the voltage level of the connection node A using a capacitor. The capacitor has the same capacitance as the coupling capacitor between the gate and the source of the first NMOS transistor N1.

When the data is read, the gate of the first NMOS transistor N1 is charged by the first gate voltage VGATE, and the gate of the precharge transistor 920 is discharged by the second gate voltage PVGATE, at the same time.

Therefore, the voltage of the connection node A due to the gate of the first NMOS transistor N1 to junction overlap is raised and the voltage of the connection node A is lowered by the voltage compensating circuit 930 at the same time, and therefore, the rise of the voltage level of the connection node A compensates for the fall of the voltage level of the connection node A and vice versa. Therefore, the voltage level of the connection node A experiences little change, which is illustrated in FIG. 10.

When the high level of data is output to the output pad DQ, the decrease of TQMAX by 13 ps may be compensated by the voltage compensating circuit 930.

As described above, a semiconductor memory device according to the present invention can output data at a high frequency without any distortion, thus ensuring superior output characteristics and greatly improved timing margin.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A semiconductor memory device, comprising:
   an output driver in which a first NMOS transistor and a second NMOS transistor are connected in series, a drain of the first NMOS transistor is connected to an output pad, and the source of the second NMOS transistor is connected to a ground voltage;
   a first driving circuit for receiving a reference voltage and generating a first internal voltage, the first internal voltage being applied to the gate of the first NMOS transistor; and
   a second driving circuit for receiving an internal supply voltage and data and generating a second internal voltage, the second internal voltage being applied to the gate of the second NMOS transistor; wherein
   a voltage level of the second internal voltage is lower than the voltage level of an external supply voltage.

2. The semiconductor memory device of claim 1, wherein the voltage level of the second internal voltage is different from the level of an operating voltage of the semiconductor memory device.

3. A semiconductor memory device, comprising:
   an output driver in which a first NMOS transistor and a second NMOS transistor are connected in series, the drain of the first NMOS transistor is connected to an output pad, and the source of the second NMOS transistor is connected to a ground voltage; and
   a driving circuit which applies a driving voltage to the gate of the second NMOS transistor in response to data and an internal supply voltage; wherein
   a ground voltage level of the driving circuit is higher than the voltage level of the ground voltage to which the source of the second NMOS transistor is connected.

4. The semiconductor memory device of claim 3, wherein the voltage level of the driving voltage is different from the level of an operating voltage of the semiconductor memory device.

5. The semiconductor memory device of claim 3, wherein the voltage level of the driving voltage is lower than the voltage level of an external supply voltage.

6. A semiconductor memory device, comprising:
   an output driver in which a first NMOS tansistor and a second NMOS transistor are connected in series, the drain of the first NMOS transistor is connected to an output pad, and the source of the second NMOS transistor is connected to a ground voltage; and
   a precharge transistor, the source of which is connected to a connection node of the first NMOS transistor and the second NMOS transistor and the drain of which is connected to a supply voltage; wherein
   the precharge transistor is connected to a voltage compensating circuit for lowering the rise in the voltage level of the connection node due to the rise in the voltage level of the gate of the first NMOS transistor.

7. The semiconductor memory device of claim 6, wherein the voltage compensating circuit comprises a capacitor which is connected between the gate and the source of the precharge transistor.

8. The semiconductor memory device of claim 7, wherein the capacitor has the same capacitance as a coupling capacitor between the gate and the source of the first NMOS transistor.

9. The semiconductor memory device of claim 6, wherein the precharge transistor is an NMOS transistor.

* * * * *